United States Patent [19]

Nelson et al.

[11] Patent Number: 5,265,321

[45] Date of Patent: Nov. 30, 1993

[54] INTEGRATED CIRCUIT STRUCTURE WITH HEAT EXCHANGER ELEMENTS SECURED THERETO AND METHOD OF MAKING

[75] Inventors: Richard D. Nelson; Michael A. Olla; Seyed H. Hashemi; Thomas P. Dolbear, all of Austin, Tex.

[73] Assignee: Microelectronics And Computer Technology Corporation, Austin, Tex.

[21] Appl. No.: 949,182

[22] Filed: Sep. 22, 1992

[51] Int. Cl.⁵ .............................................. H05K 7/20
[52] U.S. Cl. ............................................ 29/841; 29/423; 257/706; 361/718
[58] Field of Search ................... 29/832, 423, 841; 165/80.3, 80.4, 185; 174/252, 16.3, 52.2, 52.4; 257/701, 702, 704, 706, 712, 713, 723; 361/382, 383, 385–389, 395, 400

[56] References Cited

U.S. PATENT DOCUMENTS

| | | | |
|---|---|---|---|
| 3,590,466 | 7/1971 | Moshammer | 29/423 |
| 3,686,533 | 8/1972 | Garnier | 361/386 |
| 4,009,752 | 3/1977 | Wilson | 165/81 |
| 4,136,442 | 1/1979 | Harnett | 29/423 |
| 4,244,098 | 1/1981 | Barcus | 29/596 |
| 4,333,102 | 6/1982 | Jester et al. | 357/81 |
| 4,356,864 | 11/1982 | Ariga et al. | 165/80 |
| 4,407,006 | 9/1983 | Holick et al. | 357/68 |
| 4,421,161 | 12/1983 | Romania et al. | 165/80 |
| 4,465,130 | 8/1984 | Romania et al. | 165/185 |
| 4,541,004 | 9/1985 | Moore | 357/81 |
| 4,598,308 | 7/1986 | James et al. | 357/81 |
| 4,611,238 | 9/1986 | Lewis et al. | 357/81 |
| 4,620,216 | 10/1986 | Horvath | 357/81 |
| 4,624,302 | 11/1986 | Hayden et al. | 165/80.2 |
| 4,682,208 | 7/1987 | Ohashi et al. | 357/81 |
| 4,682,651 | 7/1987 | Gabuzda | 165/80.2 |
| 4,715,430 | 12/1987 | Arnold et al. | 165/80.3 |
| 4,721,996 | 1/1988 | Tustaniwskyj et al. | 357/82 |
| 4,730,666 | 3/1988 | Flint et al. | 165/80.4 |
| 4,750,031 | 6/1988 | Miller et al. | 357/81 |
| 4,802,532 | 2/1989 | Dawes | 165/80.3 |
| 4,868,349 | 9/1989 | Chia | 174/52.4 |
| 4,878,108 | 10/1989 | Phelps, Jr. et al. | 357/81 |
| 4,888,449 | 12/1989 | Crane et al. | 174/52.4 |
| 4,899,210 | 2/1990 | Lorenzetti et al. | 357/81 |
| 4,964,458 | 10/1990 | Flint et al. | 165/80.4 |
| 4,965,660 | 10/1990 | Ogihara et al. | 357/81 |
| 4,993,482 | 2/1991 | Dolbear et al. | 165/80.2 |
| 5,006,924 | 4/1991 | Frankeny et al. | 357/82 |
| 5,022,462 | 6/1991 | Flint et al. | 165/80.4 |
| 5,057,903 | 10/1991 | Olla | 357/72 |
| 5,070,936 | 12/1991 | Carroll et al. | 165/80.4 |
| 5,083,194 | 1/1992 | Bartilson | 357/81 |
| 5,161,089 | 11/1992 | Chu | 361/385 |

OTHER PUBLICATIONS

"Liquid Cooled . . . Membrane", Loeffel, IBM Tech. Discl. Bull., vol. 20, No. 2 Jul. 1977, p. 673.
"Liquid . . . Module", Hwang, IBM Tech. Discl. Bull., vol. 20, No. 7, Dec. 1977, p. 2759.
"Deltem TM Composite Heat Sinks Introduce A New Dimension to Electronics Heat Transfer", EG&G Wakefield Engineering, Product Brochure, Jun. 1989, pp. 1–4.

*Primary Examiner*—Gerald P. Tolin
*Attorney, Agent, or Firm*—Fulbright & Jaworski

[57] ABSTRACT

An integrated circuit structure and method of making in which the circuit has a plurality of metal heat exchanger elements spaced from each other with their first ends secured to the structure. The first ends may be adhesively secured to an integrated circuit chip or the underlying substrate, and the heat exchanger may be hermetically attached. The method uses a compliant removable support block for attaching the plurality of individual heat exchanger elements to integrated circuit structures having variations in their elevation.

20 Claims, 2 Drawing Sheets

INTEGRATED CIRCUIT STRUCTURE WITH HEAT EXCHANGER ELEMENTS SECURED THERETO AND METHOD OF MAKING

BACKGROUND OF THE INVENTION

The present invention is directed to an integrated circuit structure having a heat exchanger and the method of manufacture.

The packaging of single or multiple integrated circuit chips or die and their combination with a heat exchanger has created various thermo-mechanical problems. The rigid attachment of a heat exchanger to an integrated circuit structure must be able to withstand the mismatch in the thermal expansion between the heat exchanger and the chip or substrate of the integrated circuit structure. In particular, because the coefficients of thermal expansion of the heat exchanger and the integrated circuit structure are normally quite different, the use of rigid connections and large heat exchangers create reliability problems.

SUMMARY

The present invention is directed to low cost cooling of integrated circuit structures and the invention is applicable to structures using natural or forced convection. The present invention uses a plurality of individual heat exchanger elements which are secured to an integrated circuit structure in order to provide a more reliable, lower thermal resistance combination due to thinner bond line attachment. As a result, the problem of thermo-mechanical mismatch between the structure and the heat exchanger is reduced. In addition, the invention is also applicable where hermetic packaging is desired.

More particularly, the present invention is directed to an integrated circuit structure having a heat exchanger in which the integrated circuit structure includes at least one integrated circuit chip supported by a substrate. A plurality of metal heat exchanger elements having first and second ends are provided in which the heat exchanger elements are spaced from each other and have their first ends secured in heat exchange relationship to the structure for receiving heat therefrom. The first ends may be secured directly to the chip, to the substrate adjacent to the chip, or both. In the preferred embodiment, the heat exchanger elements include a plurality of parallel extending spaced rows of metal pins which are adhesively secured to the integrated circuit chip. For increased heat transfer the first ends of the pins may include an enlarged head and the heads may include a convex surface for making better contact with the structure.

A still further object of the present invention is the provision of a diaphragm hermetically sealing the integrated circuit chip in which the heat exchanger elements sealingly extend through the diaphragm.

Still a further object of the present invention is the provision of a method of making an integrated circuit structure having a heat exchanger by preforming a removable support block supporting a plurality of spaced metal heat exchanger elements having first and second ends. The support block engages and supports the second ends of the heat exchanger elements while leaving the first ends exposed. The first ends are then secured to an integrated circuit structure having at least one integrated circuit and thereafter the support block is removed from the second ends of the heat exchanger elements thereby exposing them to the environment for removing heat from the structure.

Another object of the present invention is the hermetically sealing of the integrated circuit with a diaphragm which sealingly engages the heat exchanger elements between the first and second ends with a minimum impact on thermal performance. Preferably, the diaphragm and the heat exchanger elements are sealed together by soldering, welding or electroplating to form solid metal joints.

It is a further object of the present invention to provide a compliant, preformed support block. The support block with the heat exchanger elements is pressed against the integrated circuit structure in a direction transverse to the structure for allowing the first ends of the elements to mate with variations in the elevation of the structure. In the preferred embodiment the elements include a plurality of parallel extending spaced rows of metal pins which sealingly extend through a hermetic metal diaphragm.

Yet a still further object of the present invention is wherein the support block is formed with predrilled holes of different depths for supporting the heat exchanger elements at different elevations for accommodating variations in the integrated circuit structure.

Other and further objects, features and advantages will be apparent from the following description of presently preferred embodiments of the invention, given for the purpose of disclosure and taken in conjunction with the accompanying drawings.

DESCRIPTION OF THE PREFERRED EMBODIMENTS

Figure 1:
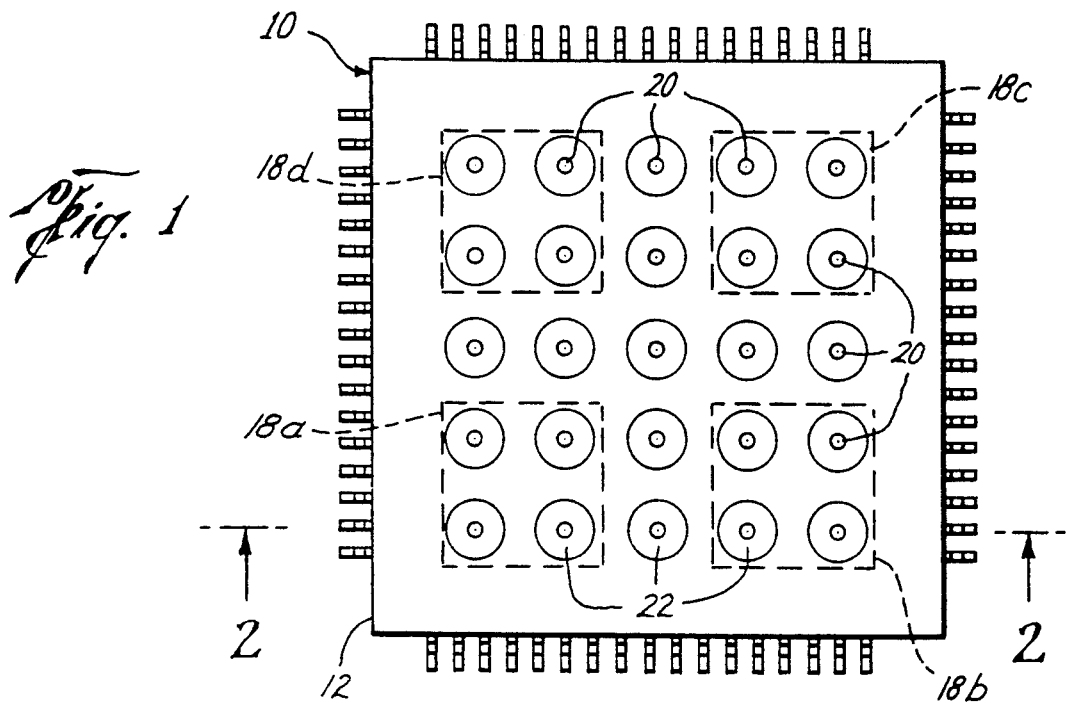
FIG. 1 is an elevational view of one type of heat exchanger element of the present invention attached to one type of integrated circuit structure.
Figure 2:
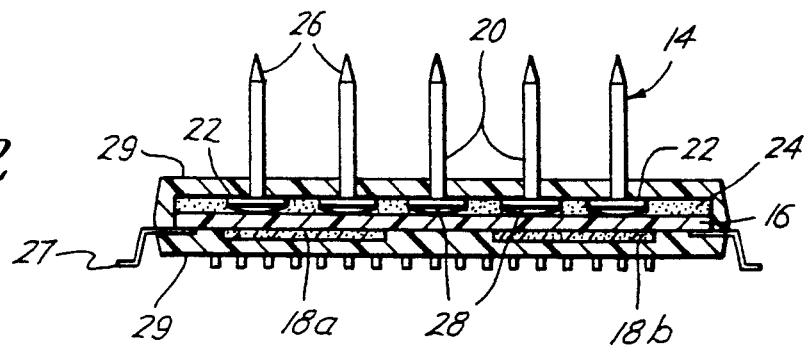
FIG. 2 is a cross-sectional view along the line 2—2 of FIG. 1.

Referring now to the drawings, and particularly to FIGS. 1 and 2, the reference numeral 10 generally indicates the integrated circuit structure having a heat exchanger of the present invention which generally includes an integrated circuit structure 12 and a heat exchanger generally indicated by the reference numeral 14. While the integrated circuit structure 12 may be any suitable single or multi-chip module, it is here shown as a substrate 16 having a plurality of integrated circuit chips or dice 18a, 18b, 18c and 18d on one side.

While the heat exchanger 14 may consist of various types of heat exchange elements such as fins, or fin segments, the preferred embodiment is a plurality of parallel extending spaced rows of metal pins 20. While the metal pins 20 may be of any suitable metal, copper or aluminum are most satisfactory. While the size of the pins may vary, pins having a diameter of 90 mils and a length of 500 mils are well suited. The use of a plurality of individual pins has several advantages. First, while a plurality of pins 20 provides a sufficient area for the heat exchanger 14 to effectively remove heat from the integrated structure circuit 12, the use of individual and spaced pins 20 also reduces the thermo-mechanical stresses between the heat exchanger 14 and the structure 12. That is, instead of creating a large concentrated thermo-mechanical stress due to changes in temperatures, which would occur with the use of large metal slugs, any thermal expansion between the heat exchanger 14 and the substrate 16 is isolated and spread to a plurality of separated locations thereby reducing a potential cause of failure.

One end of the pins 20, such as the first ends 22, are secured to and make intimate contact in heat exchange relationship with the integrated structure 12, such as to substrate 16 on the side opposite the chips. Pins 20 are secured by a satisfactory adhesive including Epotek H70E epoxy, Rogers Rflex/1000 adhesive or, more generally, any thermally conductive semiconductor grade adhesive. The second ends 26 of the pins 20 are thus exposed to the ambient surroundings for cooling by natural or forced convection. Furthermore, the pins 20 are omni-directional in that they can be positioned in various orientations and cooled by a cooling medium flowing from any direction. Preferably, the first ends 22 of the pins 20 include an enlarged head 28 for heat spreading. Advantageously, a large percentage of the contact area between the structure 12 and the heat exchanger 14 uses metal contact instead of adhesive contact which reduces the overall thermal resistance to the flow of heat. The pin size, pitch or height can be spatially varied to tailor local cooling on the structure 12. Preferably, the heads 28 have a slightly convex profile which ensures that the heads 28 make good contact with the substrate 16. Therefore, the present invention provides somewhat lower cost and improved performance due to thinner bond lines between the structure 12 and the heat exchanger 14. The heads 28 of the pins 20 serve to provide a high thermal conductivity path for heat to flow from the chips to the first ends 22 of the pins 20. This will avoid a large temperature rise in the adhesive 24 due to heat flow constriction in the low conductivity adhesive 24. Moreover, the isolated nature of each individual pin 20 reduces the concern for cracking of the connection between the pins 20 and the structure 12 during environmental temperature swings.

Structure 10 may further include leadframe leads 27 connected directly to substrate 16 and indirectly to integrated circuit chips 18a, 18b, 18c and 18d. The chips can be directly connected to substrate 16 by tape-automated-bonding (TAB) leads, wire bonds, flip-chip attachment or other well known techniques. Whichever the case, leads 27 must be in electrical contact with the chips. In addition, the chips are normally protected by being positioned within some type of enclosure. For example, an encapsulant 29 is seen to enclose the chips and substrate as is conventional. Alternatively, in place of encapsulant 29 the chips may be enclosed by a sealed lid (not shown).

Figure 3:
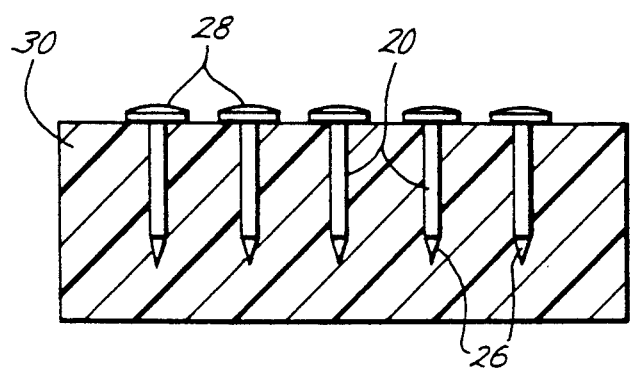
FIG. 3 is a cross-sectional view of the first step of manufacture of the structure of FIGS. 1 and 2.

The method of manufacture of the structure and heat exchanger 10 of FIGS. 1 and 2 is preferably performed by preforming a removable support block 30, as best seen in FIG. 3, by inserting the heat exchange elements or pins 20 into a holder, such as a styrofoam block, nylon or polyurethane. For illustration purposes, block 30 serves to hold the pins 20 prior to their being attached to the substrate 16 by the adhesive 24. It is noted that the block 30 supports the plurality of pins 20 in which the pins 20 are spaced from each other. Secondly, the block 30 engages and supports the second ends 26 of the pins 20, while leaving the first ends or heads 28 exposed. The block 30 is then used to hold and force the heads 28 of the pins 20 into the adhesive 24. It is desirable that the block 30 be compliant or flexible so as to allow the heads 28 to accommodate any variations in the elevational height of the surface of the substrate 16 and thereby obtain a good thermal contact. After securing the heads 28 in the adhesive 24, the block 30 is removed, either mechanically or chemically by a solvent, thereby leaving the structure shown in FIGS. 1 and 2.

Other and further embodiments of the present invention may be provided wherein like parts to those shown in FIGS. 1 and 3 are similarly numbered with the addition of the suffix "a" and "b". For example, in flip-chip applications it is desirable to remove heat from the back sides of the integrated circuit chips. With back side heat removal it may also be advantageous to provide a hermetic enclosure by using a diaphragm.

Figure 5:
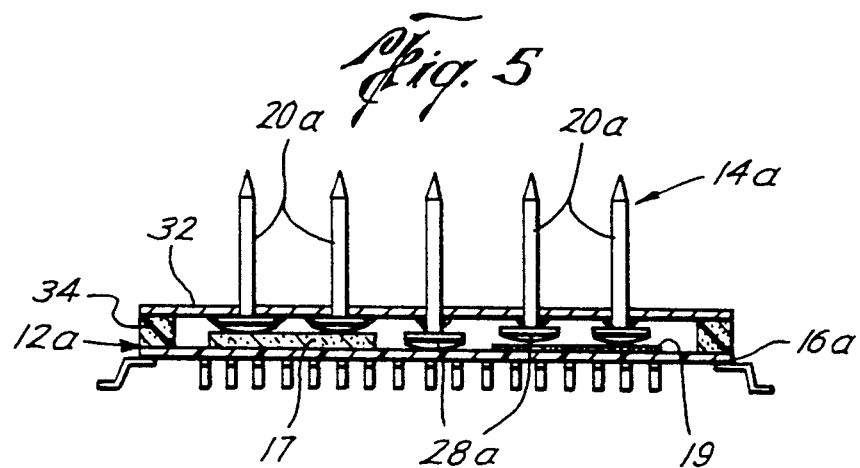
FIG. 5 is a cross-sectional view of another embodiment of the present invention utilizing the step of manufacture of FIG. 4.

Thus, referring to FIG. 5, a substrate 16a is provided having a plurality of integrated circuit chips 17 and 19 of different heights, all of which form the integrated circuit structure 12a. Again, a heat exchanger, generally indicated by the reference numeral 14a, is provided, such as a plurality of spaced rows of metal pins 20a having heads 28a for contact with the back sides of integrated circuit chips 17 and 19 and with the substrate 16a. In this case, in order to provide a hermetic module, a diaphragm material 32, such as metal, which can be copper or aluminum, has its edges sealed by a hermetic seal 34, as is conventional, to the substrate 16a. The pins 20a sealingly extend through the diaphragm 32 to remove heat from the module 10a. The thermal expansion of the diaphragm 32 provides only small loads since it is thin. The pins 20a may be of different lengths or extend different distances outwardly so that the heads 28a can contact an array of chips or other surfaces which are not coplanar.

Figure 4:
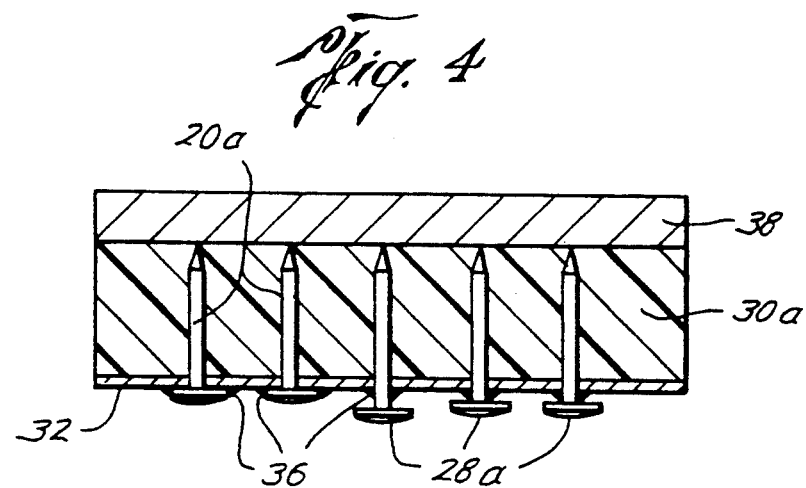
FIG. 4 is the first step in the method of manufacture of another embodiment of the present invention utilizing a hermetic seal.

Again, as best seen in FIG. 4, the method of manufacture includes providing a compliant or flexible support block 30a upon which the diaphragm 32 is laid. The pins 20a are then punched through the diaphragm 32 and into the support block 30a. The seal 36 between the pins 20a and the diaphragm 32 may be achieved by any conventional method, such as soldering, welding or electroplating to form solid metal joints therebetween. It is noted that different length pins 20a provide the desirable elevation of the heads 28a. If desired, a backup plate 38 may be provided to transversely press the compliant block 30a containing the pins 20a to accommodate any tolerances or local variations in the elevation of the surfaces to be contacted. The use of the compliant block 30a provides uniformly thin bond lines for all of the pins 20a.

Figure 6:
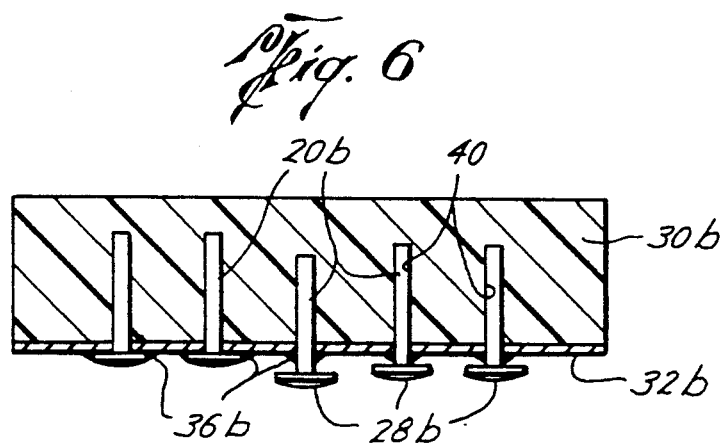
FIG. 6 is another embodiment of the first step of manufacture of providing a heat exchanger for an integrated circuit structure having variations in elevation.

Referring to FIG. 6, a further embodiment is shown of a preformed block 30b in which pins 20b of equal length are inserted through a diaphragm 32b into predrilled holes 40 in the block 30b. The holes 40 may be of different depth for suitably positioning the heads 28b of the pins at the desired locations.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts and steps of the method, may be made without departing from the spirit of the invention and the scope of the appended claims.

What is claimed is:

1. A method of making an integrated circuit structure having a heat exchanger, comprising:

preforming a removable support block supporting a plurality of spaced metal heat exchanger elements having first and second ends, said support block engaging and supporting the second ends of the heat exchanger elements while leaving the first ends exposed;

securing the first ends of the elements to an integrated circuit structure having at least one integrated circuit chip; and removing the support block from the second ends of the heat exchanger elements.

2. The method of claim 1 wherein said preformed support block is complaint and is pressed against the integrated circuit structure in a direction transverse to the structure for allowing the first ends of the elements to comply with variations in the elevation of the structure.

3. The method of claim 1 including, hermetically sealing the said at least one integrated circuit chip with a diaphragm which sealingly engages the heat exchanger elements between the first and second ends.

4. The method of claim 3 wherein the diaphragm and the heat exchange elements are sealed together by soldering, welding or electroplating.

5. The method of claim 3 wherein the first ends are mechanically secured to the integrated circuit structure on the side having said at least one chip.

6. The method of claim 1 wherein the support block is formed with holes of different depths for supporting the heat exchanger elements at different elevations.

7. The method of claim 1 wherein the support block is selected from the group consisting of styrofoam, nylon and polyurethane.

8. A method of making an integrated circuit structure having a heat exchanger, comprising:

preforming a flexible, removable support block having a metal diaphragm, said block supporting a plurality of spaced metal heat exchanger elements, said elements including a plurality of parallel extending spaced rows of metal pins having first and second ends, said support block engaging and supporting the second ends of the pins while leaving the first ends exposed while positioning the diaphragm between the first and second ends;

sealing the diaphragm and pins together;

securing the first ends of the pins in heat exchange relationship to an integrated circuit structure having a substrate supporting at least one integrated circuit chip;

sealing the diaphragm to the substrate thereby hermetically enclosing said at least one integrated circuit chip; and removing the support block from the second ends of the pins.

9. The method of claim 8 wherein the some first ends are secured to said at least one chip and other first ends are secured to the substrate.

10. The method of claim 8 wherein said preforming step includes laying the diaphragm on the support block and then punching the pins through the diaphragm and into the support block.

11. The method of claim 10 wherein the pins are punched through the support block.

12. The method of claim 10 wherein the pins are inserted into predrilled holes in the support block.

13. The method of claim 12 wherein the predrilled holes have different depths for supporting the pins at different elevations.

14. The method of claim 8 wherein the diaphragm and pins are sealed together by soldering, welding or electroplating.

15. The method of claim 8 wherein the first ends of the pins are adhesively secured to the integrated circuit structure.

16. The method of claim 15 wherein the adhesive is an epoxy.

17. The method of claim 8 wherein the first ends of the pins are mechanically secured to the integrated circuit structure by a downward force provided by the diaphragm.

18. The method of claim 8, including positioning the diaphragm against a side of the support block, positioning a backup plate against the side of the support block opposite the diaphragm, and securing the first ends of the pins to the integrated circuit structure by transversely pressing the backup plate toward the integrated circuit structure.

19. The method of claim 8 wherein the support block is removed mechanically.

20. The method of claim 8 wherein the support block is removed chemically by a solvent.

* * * * *